United States Patent
Li et al.

(10) Patent No.: US 6,228,280 B1
(45) Date of Patent: *May 8, 2001

(54) ENDPOINT DETECTION BY CHEMICAL REACTION AND REAGENT

(75) Inventors: Leping Li, Poughkeepsie, NY (US); James Albert Gilhooly, Saint Albans; Clifford Owen Morgan, III, Burlington, both of VT (US); Cong Wei, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/073,607

(22) Filed: May 6, 1998

(51) Int. Cl.⁷ .................................................. H01L 21/304

(52) U.S. Cl. ................................ 216/84; 216/90; 438/692

(58) Field of Search ....................... 156/345; 216/83–85, 216/90–93, 38; 438/690–693

(56) References Cited

U.S. PATENT DOCUMENTS

| 3,503,711 | 3/1970 | Skala ........................................ 23/232 |
| 3,904,371 | 9/1975 | Neti et al. ............................... 23/232 |
| 4,493,745 | 1/1985 | Chen et al. ............................. 156/626 |
| 4,512,964 | 4/1985 | Vayenas .................................. 423/403 |
| 4,812,416 | 3/1989 | Hewig et al. ............................. 437/5 |
| 4,819,478 * | 4/1989 | Melcher .................................. 73/61.1 |
| 4,961,834 | 10/1990 | Kuhn et al. ............................ 204/412 |
| 4,975,141 | 12/1990 | Greco et al. ........................... 156/626 |
| 5,234,567 | 8/1993 | Hobbs et al. ........................... 204/415 |
| 5,242,532 | 9/1993 | Cain ....................................... 156/626 |

(List continued on next page.)

FOREIGN PATENT DOCUMENTS

| 3277947 | 12/1991 | (JP) .............................. G01N/21/77 |

OTHER PUBLICATIONS

Park, et al, "Real Time Monitoring of NH, Concentration Using Diffusion Scrubber Sampling Technique and Result of Application to the Processing of Chemiacally Amplified Resists", JPN. J. Appl. Phys. vol. 34 (1995) pp. 6770–6773 Part I No. 12B, Dec., 1995.

Carr, et al, Technical Disclosure Bulletin, "End–Point Detection of Chemical/Mechanical Polishing of Circuitized Multilayer Substrates", YO887–0456, vol. 34 No. 4B, Sep. 1991 p. 406–407.

Carr, et al, Technical Disclosure Bulletin, "End Point Detection of Chemical/Mechanical Polishing of Thin Film Structures", YO886–0830, vol. 34 No. 4A, Sep. 1991, p. 198–200.

Rutten, Research Disclosure Endpoint Detection Method for Ion Etching of Material Having a Titanium Nitride Underlayer, BU890–0132, Feb. 1991, No. 322, Kenneth Mason Publications Ltd, England.

Biolsi, et al, "An Advanced Endpoint Detection Solution for <1% Open Areas", Solid State Technology, Dec. 1996, p. 59–67.

Economou, et al, "In Situ Monitoring of Etching Uniformity in Plasma Reactors", Solid State Technology, Apr., 1991, p. 107–111.

Roland, et al, "Endpoint Detecting in Plasma Etching", J. Vac. Sci. Technol. A3(3), May/Jun. 1985, p. 631–636.

*Primary Examiner*—Gregory Mills
*Assistant Examiner*—Alva C Powell
(74) *Attorney, Agent, or Firm*—Alison D. Mortinger; Jay H. Anderson

(57) ABSTRACT

A method for detecting the endpoint for removal of a target film overlying a stopping film by chemical-mechanical polishing using a slurry, by removing the target film with a polishing process that generates a chemical reaction product (for example ammonia when polishing a wafer with a nitride film in a slurry containing KOH) in the slurry, adding to the slurry a reagent which produces a characteristic result upon reacting with the chemical reaction product, and monitoring the slurry for the characteristic result as the target film is removed.

9 Claims, 3 Drawing Sheets

U.S. PATENT DOCUMENTS

| | | | |
|---|---|---|---|
| 5,242,882 | 9/1993 | Campbell | 502/325 |
| 5,256,387 | 10/1993 | Campbell | 423/392 |
| 5,395,589 | 3/1995 | Nacson | 422/88 |
| 5,399,234 | 3/1995 | Yu et al. | 156/636 |
| 5,405,488 | 4/1995 | Dimitrelis et al. | 156/627 |
| 5,439,551 | 8/1995 | Meikle et al. | 156/626 |
| 5,559,428 | 9/1996 | Li et al. | 324/71.5 |
| 5,770,095 * | 6/1998 | Sasaki et al. | 216/38 |
| 6,066,564 * | 5/2000 | Li et al. | 438/692 |

\* cited by examiner

ENDPOINT DETECTION BY CHEMICAL REACTION AND REAGENT

RELATED APPLICATIONS

This invention is related to the following U.S. Patent applications:

application Ser. No. 09/073,605 now U.S. Pat. No. 6,066,564, entitled "Indirect Endpoint Detection by Chemical Reaction";

application Ser. No. 09/073,601, entitled "Endpoint Detection by Chemical Reaction and Light Scattering";

application Ser. No. 09/073,602, entitled "Endpoint Detection by Chemical Reaction";

application Ser. No. 09/073,603, entitled "Reduction of a Gaseous Product in Solution";

application Ser. No. 09/073,604, now U.S. Pat. No. 6,126,848 entitled "Indirect Endpoint Detection by Chemical Reaction and Chemiluminescence"; and application Ser. No. 09/073,606, entitled "Endpoint Detection by Chemical Reaction and Photoionization";

all filed on the same day, all assigned to the present assignee, and all incorporated by reference in their entireties.

FIELD OF THE INVENTION

This invention is directed to semiconductor processing and more particularly to the detection of the endpoint for removal of one film overlying another film.

BACKGROUND OF THE INVENTION

In the semiconductor industry, critical steps in the production of integrated circuits are the selective formation and removal of films on an underlying substrate. The films are made from a variety of substances, and can be conductive (for example metal or a magnetic ferrous conductive material) or non-conductive (for example an insulator). Conductive films are typically used for wiring or wiring connections. Non-conductive or dielectric films are used in several areas, for example as interlevel dielectrics between layers of metallization, or as isolations between adjacent circuit elements.

Typical processing steps involve: (1) depositing a film, (2) patterning areas of the film using lithography and etching, (3) depositing a film which fills the etched areas, and (4) planarizing the structure by etching or chemical-mechanical polishing (CMP). Films are formed on a substrate by a variety of well-known methods, for example physical vapor deposition (PVD) by sputtering or evaporation, chemical vapor deposition (CVD), plasma enhanced chemical vapor deposition (PECVD). Films are removed by any of several well-known methods, for example chemical-mechanical polishing (also known as CMP), dry etching such as reactive ion etching (RIE), wet etching, electrochemical etching, vapor etching, and spray etching.

It is extremely important with removal of films to stop the process when the correct thickness has been removed (the endpoint has been reached). With CMP, a film is selectively removed from a semiconductor wafer by rotating the wafer against a polishing pad (or rotating the pad against the wafer, or both) with a controlled amount of pressure in the presence of a slurry. Overpolishing (removing too much) of a film results in yield loss, and underpolishing (removing too little) requires costly rework (redoing the CMP process). Various methods have been employed to detect when the desired endpoint for removal has been reached, and the polishing should be stopped.

The prior art methods for CMP endpoint detection suitable for all types of films involve the following types of measurement: (1) simple timing, (2) friction by motor current, (3) capacitive, (4) optical, (5) acoustical, and (6) conductive.

An exception to the above is U.S. Pat. No. 5,399,234 to Yu et al, in which a chemical reaction is described between potassium hydroxide in the polishing slurry and the layer being polished. The endpoint for polishing is monitored by sending acoustic waves through the slurry and detecting changes in the acoustic velocity as the concentration of reaction product (thought to be silanol in the case of polishing silicon dioxide) from the layer being polished decreases upon reaching an underlying polish stop layer.

These prior art methods each have inherent disadvantages such as inability for real-time monitoring, the need to remove the wafer from the process apparatus for examining the completion of polishing (not in-situ), or a lack of sensitivity.

These disadvantages have been overcome with an in-situ endpoint detection scheme for conductive films as described in U.S. Pat. No. 5,559,428 to Li et al titled "In-Situ Monitoring of the Change in Thickness of Films," however a suitable endpoint detection for non-conductive films has yet to be described.

Thus, there remains a need for an in-situ, real-time endpoint detection scheme suitable for use with all types of films. Such a scheme should have high detection sensitivity and extremely fast response time, preferably less than 1 or 2 seconds.

SUMMARY OF THE INVENTION

It is therefore an object of the present invention to provide a method and apparatus for detecting the endpoint for removal of any type of film overlying another film.

Another object of the present invention is to provide for in-situ endpoint detection as the film is being removed.

Yet another object is to provide endpoint detection with high detection sensitivity and extremely fast response time.

In accordance with the above listed and other objects, a method for detecting the endpoint for removal of a target film overlying a stopping film by chemical-mechanical polishing using a slurry, by (a) removing the target film with a process that generates a chemical reaction product in the slurry, (b) adding to the slurry a reagent which produces a characteristic result upon reacting with the chemical reaction product, and (c) monitoring the slurry for the characteristic result as the target film is removed is described.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENTS

The present invention is described herein in the context of chemical-mechanical polishing merely as a specific example, and is not meant to limit applicability of the invention to semiconductor technology. Those skilled in the art will understand that the invention is broadly applicable to any process in which it is desirable to detect the endpoint for removal of a target film overlying a stopping film by chemical-mechanical polishing using a slurry, by (a) removing the target film with a process that generates a chemical reaction product in the slurry, (b) adding to the slurry a reagent which produces a characteristic result upon reacting with the chemical reaction product, and (c) monitoring the slurry for the characteristic result as the target film is removed.

Figure 1:
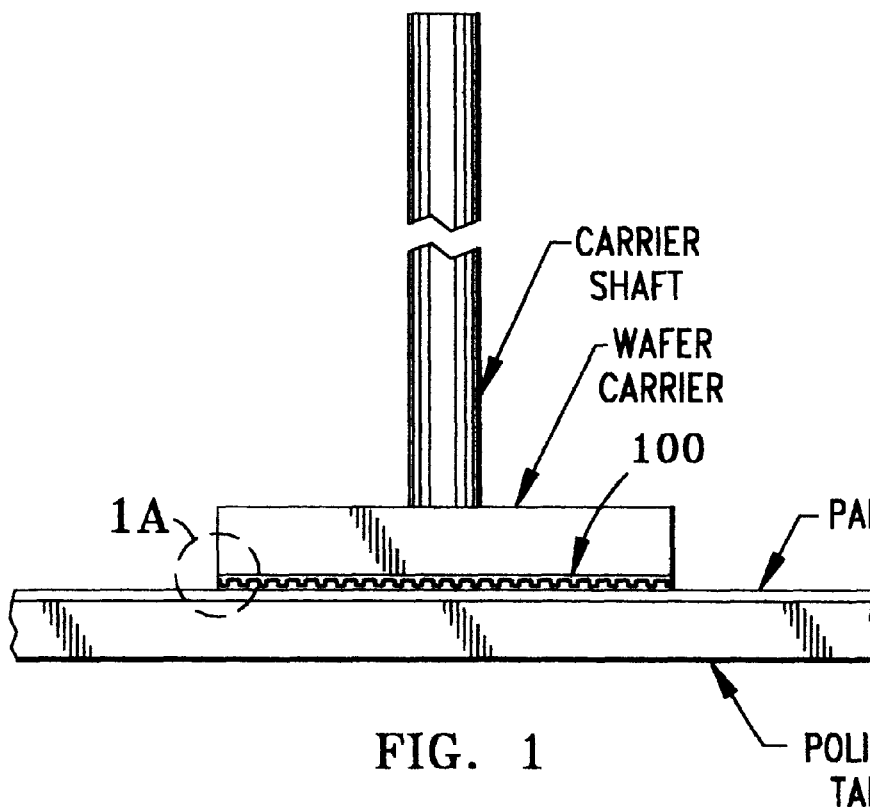
FIG. 1 shows a cross-section of a target film to be chemically-mechanically polished.
Figure 1A:
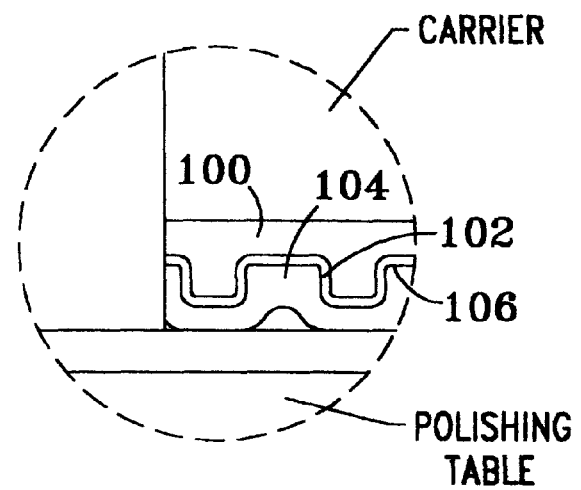

As shown in FIG. 1, we have discovered that when chemically-mechanically polishing a substrate 100 with a target film of oxide ($SiO_2$) 104 over a stopping film of nitride ($Si_3N_4$) 102 with a slurry containing potassium hydroxide (KOH), a chemical reaction occurs when the interface 106 is reached, resulting in the production of ammonia ($NH_3$). More specifically, the slurry used is a mixture of fumed silica, water, and KOH, with a pH of about 10.5. When polishing oxide, the following reaction occurs:

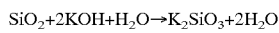

$$SiO_2 + 2KOH + H_2O \rightarrow K_2SiO_3 + 2H_2O$$

When polishing nitride, the following reaction occurs:

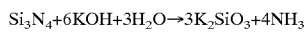

$$Si_3N_4 + 6KOH + 3H_2O \rightarrow 3K_2SiO_3 + 4NH_3$$

The ammonia produced is dissolved in the slurry. Thus the change in ammonia level in the slurry indicates that the underlying nitride film has been reached, and the endpoint for removal of the oxide film can be determined by monitoring the level of ammonia in the slurry. Once the endpoint is reached, the polishing is stopped.

More generally, the endpoint for removal of any non-nitride-containing film overlying a nitride-containing film can be detected by monitoring the level of ammonia in the slurry. Conversely, the endpoint for removal of a nitride-containing film overlying a non-nitride-containing film can also be detected in a similar manner, with a marked decrease in the presence of ammonia indicating the endpoint.

Even more generally, the endpoint for removal of any film overlying another film can be detected by monitoring the level of a chemical reaction product in the slurry as a component of the slurry reacts selectively with one of the films (either the overlying or underlying film). The reaction described above producing ammonia will be discussed as follows but is not intended to limit the scope of the invention to that particular embodiment. In order to implement the above discovery concerning the production of ammonia in an environment suitable for manufacturing, in-situ (i.e. while the wafer is being polished) slurry collection and sampling is required. Preferably, the collection and sampling provide a rapid response with high sensitivity (to ammonia) and minimizes the effect of interference from other substances in the slurry and in the surrounding air.

Unfortunately, the slurry described above already contains ammonia prior to being used for polishing. The ammonia concentration varies from as low as $5.0 \times 10^{-6}$ M to as high as $5.0 \times 10^{-5}$ M. The ammonia produced in the slurry when polishing a blanket (i.e. uniform) layer of nitride is approximately $1.0 \times 10^{-4}$ M at room temperature; for a typical low pattern factor production wafer having a nitride layer which covers 15% of the wafer area (the rest being oxide), polishing at the interface of the oxide/(oxide+nitride) produces $1.5 \times 10^{-5}$ M. In this case, the desired concentration change will not be able to be distinguished from the fluctuation of the pre-polish ammonia concentration. Therefore the ammonia concentration prior to polishing this type of wafer must be reduced in order to achieve the desired sensitivity.

Figure 2:
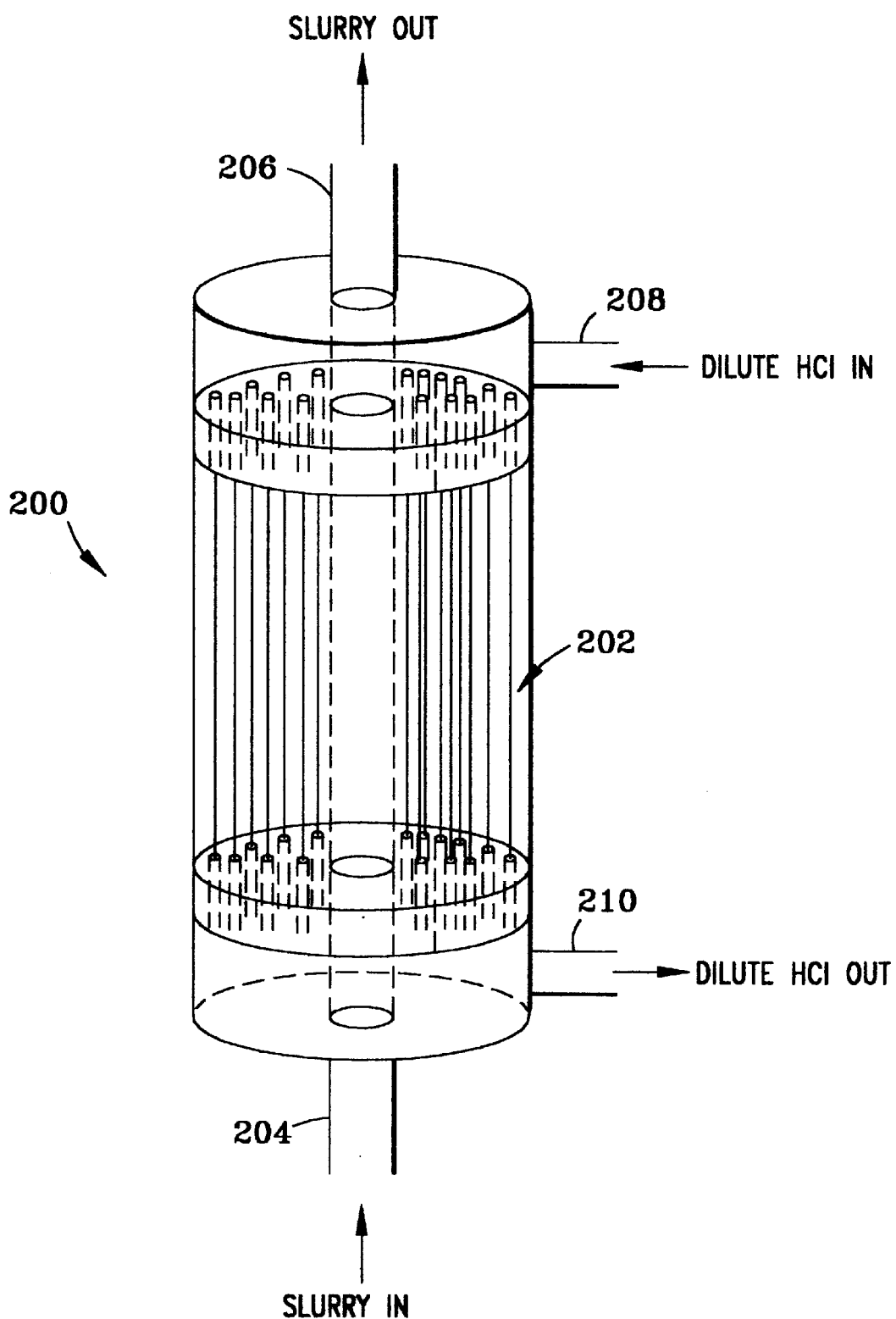
FIG. 2 shows a cross-section of an ammonia scrubber for reducing pre-polish ammonia concentration in the slurry.
Figure 3:
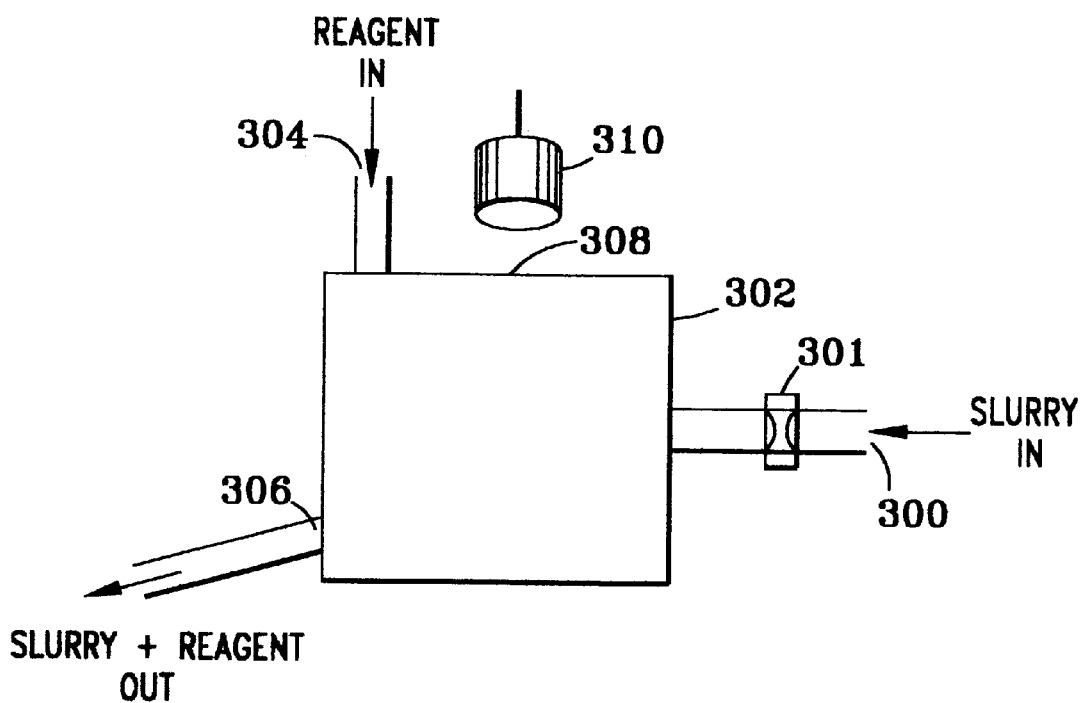
FIG. 3 shows the setup for slurry sampling and ammonia detection using a reagent; all in accordance with the present invention.

The reduction in pre-polish ammonia concentration can be achieved if necessary by using an ammonia scrubber. In the above case, the scrubber reduced the concentration to approximately $2.5 \times 10^{-6}$ M. The main component of the scrubber is a Liqui-Cel Membrane Contactor 100 (model Extra-Flow 4×28 made by Hoechst Celanese) shown in FIG. 2. The Contactor contains Celgard (TM) microporous polypropylene fibers 202 which are hydrophobic and do not allow water-based solutions to penetrate through the fiber membranes, but do allow gas exchange. Slurry from a reservoir enters contactor 200 at 204 and flows through contactor 200 on the outside of the fibers (also called shellside) allowing ammonia to permeate to the inside of the fibers (also called lumenside) before exiting at 206 and recirculating back to 204. To facilitate removal of the ammonia in the slurry, an aqueous HCl solution from another reservoir with a pH of approximately 3 is circulated in the lumenside, entering at 208 and exiting at 210 before recirculating back to 208. Ammonia gas from the slurry crossing into this HCl stream is immediately converted to $NH_4^+$ by a moderately high concentration of protons, therefore effectively preventing a possible buildup of any appreciable amount of $NH_3$ in the lumenside of the scrubber. The recirculating aqueous HCl stream and reservoir can then be the sink for a large amount of ammonia from the slurry.

With an aqueous HCl reservoir of approximately 10 liters of water adjusted to a pH of 3.5 using 0.1 M HCl solution, and 10 liters of $1.0 \times 10^{-4}$ M ammonia solution at a pH of 10.7 passing through the above-described contactor, the ammonia level was reduced to the desired $2.5 \times 10^{-6}$ M in 30 minutes. The time can be reduced by increasing the size of the contactor, using several contactors in series, or gently heating the slurry to increase the volatility of the ammonia, or any combination of the three. The desired target ammonia level in the slurry can be measured by a commercially available detector such as an ammonia specific ion selective electrode (ISE).

Once the slurry has reached the desired target ammonia level, it is used to polish a wafer. The slurry is collected from the polishing pad for sampling during the polishing process. The slurry is then analyzed by using an appropriate reagent to indicate the presence or absence of the chemical reaction product.

In order to detect liquid ammonia in the slurry (milky white in color) a suitable choice is to use Nessler Reagent (an alkali solution of potassium tetraiodomecurate(II)), which turns a characteristic brownish color upon reacting with the ammonia. Slurry 300 from a point on the polishing pad 108 (shown in FIG. 1) after the wafer being polished is continuously pumped through an inlet valve 301 to a reservoir 302. Nessler Reagent 304 is delivered to reservoir 302 in a pulsed manner. An opening 306 in reservoir 302 is used to discharge the slurry/reagent mix to a waste container (not shown). Valve 301 and opening 306 are adjusted so that a dynamic balance of slurry in reservoir 302 can be reached and retained. More specifically, slurry constantly flows into the reservoir and constantly drains out yet there is enough fresh slurry that stays in the reservoir for the purpose of detecting ammonia.

Reservoir 302 has at least one wall or a portion of a wall 308 that is transparent. A color sensor 310 (commercially available) is positioned outside the transparent portion 308 of reservoir 300 and signals a color change as the Nessler Reagent reacts with any ammonia in the slurry. This method is capable of detecting ammonia at concentrations down to $5 \times 10^{-6}$ Molar (about 100 ppb), with the color change occurring in less than 1 second.

Once the characteristic color change is observed, the nitride layer is exposed, and polishing is stopped as desired (polishing may be continued for a certain period of time known in the industry as "overpolishing"). A computer may be set up to control the process and acquire a signal from the color sensor and send a signal back to the polisher to stop polishing.

Note also that other reagents may be used for endpoint detection, depending on the chemical reaction product produced during the film removal process. Generally, a reagent added to the slurry will cause a reaction which produces a characteristic result such as a color change, photons (i.e. emitted light), or a precipitate.

Exemplary equipment used to detect the characteristic result has been described in the case of a color change. To detect photons, a suitable sensor such as a conventional photomultiplier tube or infrared sensor would be used. To detect a precipitate, light scattering apparatus may be used.

In summary, a method and associated apparatus have been described which are capable of detecting the endpoint for removal of any type of film overlying another film. The present invention provides for in-situ endpoint detection as the film is being removed, and with high detection sensitivity and extremely fast response time.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method for detecting the endpoint for removal of a target film overlying a stopping film by chemical-mechanical polishing using a slurry, comprising the steps of:

(a) removing the target film with a polishing process wherein a chemical reaction between the slurry and the stopping film generates a chemical reaction product in the slurry;

(b) adding to the slurry a reagent which produces a characteristic result upon reacting with the chemical reaction product; and (c) monitoring the slurry for the characteristic result as the target film is removed.

2. The method of claim 1 wherein the characteristic result is a color change.

3. The method of claim 1 wherein the characteristic result is an emission of light.

4. The method of claim 3 wherein the light emission is monitored by photomultiplication.

5. The method of claim 1 wherein the characteristic result is formation of a precipitate.

6. The method of claim 5 wherein the precipitate formation is monitored by light scattering.

7. The method of claim 1 further comprising the step of stopping the polishing when the endpoint has been reached.

8. The method of claim 1 wherein the chemical reaction product is ammonia.

9. The method of claim 8 wherein the reagent is Nessler Reagent, the characteristic result is a color change.

* * * * *